US005861326A

United States Patent [19]
Yamazaki et al.

[11] Patent Number: 5,861,326
[45] Date of Patent: Jan. 19, 1999

[54] METHOD FOR MANUFACTURING SEMICONDUCTOR INTEGRATED CIRCUIT

[75] Inventors: Shunpei Yamazaki, Tokyo; Satoshi Teramoto, Kanagawa, both of Japan

[73] Assignee: Semiconductor Energy Laboratory Co. Ltd., Kanagawa-ken, Japan

[21] Appl. No.: 600,162

[22] Filed: Feb. 12, 1996

[30] Foreign Application Priority Data

Mar. 24, 1995 [JP] Japan ................................... 7-019254

[51] Int. Cl.⁶ ................................................... H01L 21/00
[52] U.S. Cl. ............................................ 438/149; 438/635
[58] Field of Search ............................ 349/46, 139, 149, 349/151, 152; 257/59, 72; 438/149, 151, 158, 163, 165, 635

[56] References Cited

U.S. PATENT DOCUMENTS

| | | | |
|---|---|---|---|
| 5,359,206 | 10/1994 | Yamamoto et al. | 257/59 |
| 5,422,293 | 6/1995 | Konya | 437/50 |
| 5,576,225 | 11/1996 | Zhang et al. | 437/21 |

FOREIGN PATENT DOCUMENTS 2-210420  8/1990  Japan .
2-216129  8/1990  Japan .

*Primary Examiner*—Charles Bowers
*Assistant Examiner*—Scott J. Hawranek
*Attorney, Agent, or Firm*—Sixbey, Friedman, Leedom & Ferguson, PC; Gerald J. Ferguson, Jr.; Eric J. Robinson

[57] ABSTRACT

In a semiconductor integrated circuit for forming an offset gate structure by utilizing an anodic oxidation film fabricated around a gate electrode, even when a length of a gate line becomes long, the anodic oxidation film can be made uniform, and also electric characteristics of thin-film transistors can be matched with each other. In a semiconductor integrated circuit manufacturing method, a large number of insulated gate type field-effect transistors are connected with respect to a single gate line. This manufacturing method is comprised by steps of: forming a film made of a material capable of performing an anodic oxidation for constructing the single gate line; forming a plurality of gate lines, a large number of gate electrodes extended from the plural gate lines, and a power supply line connected to the large number of gate electrodes by patterning the film; and forming an anodic oxide layer on at least an exposed surface of the gate electrode by supplying a current to the power supply line in an electrolytic solution.

16 Claims, 5 Drawing Sheets

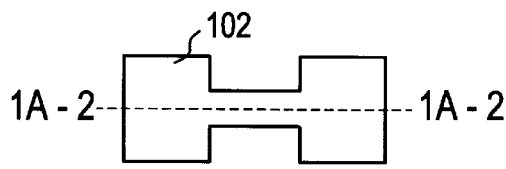
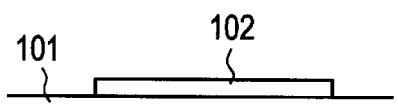
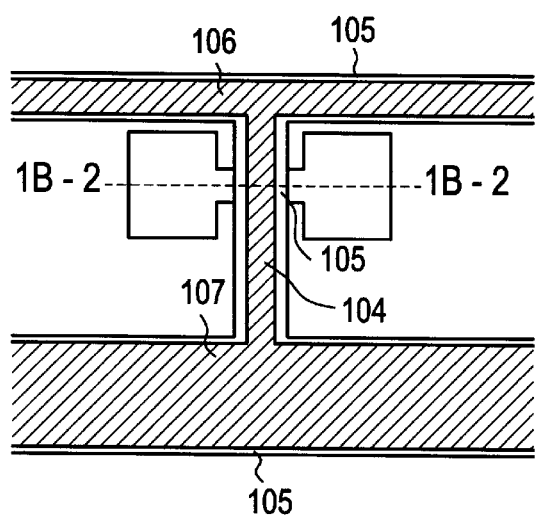
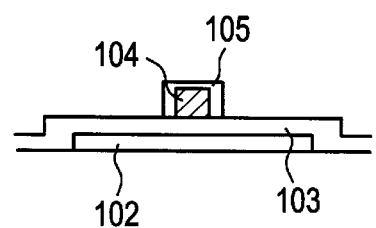
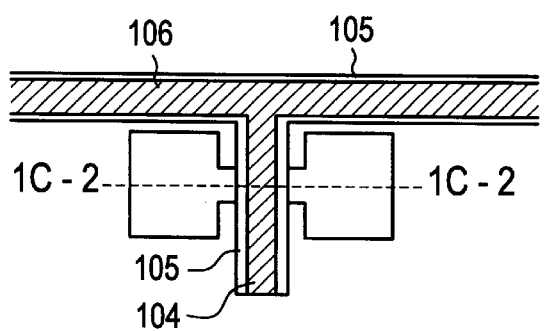
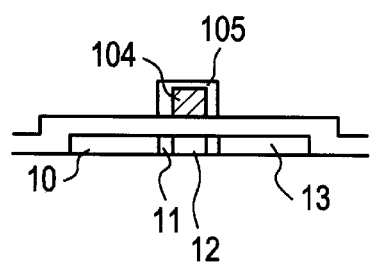

METHOD FOR MANUFACTURING SEMICONDUCTOR INTEGRATED CIRCUIT

BACKGROUND OF THE INVENTION

1. Field of the Invention

The present invention relates to a method for manufacturing a thin-film integrated circuit typically known as an active matrix type liquid crystal display device. Also, the present invention is related to another method for manufacturing an integrated circuit with employment of a semiconductor device where wiring patterns and electrodes have been formed by utilizing the anodic oxidation technique.

2. Description of the Related Art

Very recently, great attentions are paid for thin-film transistors constructed by employing thin-film semiconductors fabricated on glass substrates. The thin-film transistors are mainly utilized in active matrix type liquid crystal display devices. An active matrix type liquid crystal display device has such a structure that thin-film transistors are connected to the respective pixel electrodes, and electric charges entered into and derived from these pixel electrodes are controlled by the thin-film transistors. These pixel electrodes are arranged in a matrix form made of several hundreds of pixels.

A thin-film transistor connected to a pixel electrode requires such a characteristic of a low OFF current thereof. This is because electric charges held by the pixel electrode should be held for predetermined time. However, generally speaking, the normal thin-film semiconductors are made under amorphous state, or polycrystal state. Therefore, practically speaking, the existence of the OFF current flowing through the grain boundary is not negligible.

As the structures used to cancel or suppress the existence of this OFF current, various structures have been proposed that the LDD (light dope region) structure is fabricated and the offset gate region is formed. This LDD structure is described in Japanese Patent Publication No. 3-38755 (in 1991). The offset gate structure is described in Japanese Laid-open Patent Application No. 4-360580 (in 1992).

The conventional technique described in Japanese Laid-open Patent Application No. 4-360580 can form the offset gate structure in the self-alignment manner and thus can achieve the high productivity. In accordance with this prior art technique, the gate electrode is fabricated by employing aluminum as the material thereof, and the anodic oxidation is carried out while using this gate electrode as the anode, so that the oxide layer is formed around the gate electrode, and furthermore, the offset gate region is fabricated by using a portion of the gate electrode having the same thickness as that of this oxide layer.

Since the thickness of the oxide layer may be controlled by controlling the voltages applied during the anodic oxidation in accordance with this conventional technique for manufacturing the oxide layer by utilizing this anodic oxidizing technique, the high reproducibility can be achieved. In particular, in the thin-film transistor having the offset gate structure, the characteristics of the thin-film transistors are greatly different from each other, depending upon the dimensions of the offset structures. Accordingly, it is very important to realize such a technique for correctly forming the dimensions of the offset gate structures under better controls. Therefore, the technique for fabricating the anodic oxide layer around the gate electrode under better controls may form a large number of thin-film transistors whose electric characteristics are matched with each other, resulting in a very useful technique.

On the other hand, a strong demand is made of such a design rule that dimensions of thin-film transistors arranged in a pixel region of an active matrix type liquid crystal display device should be reduced as small as possible. This is because the numerical aperture of the pixel should be increased. Since the pixel is required to pass light therethrough, the dimension of the pixel part which may interrupt the light transmission could be preferably made as small as being permitted.

Under these circumstances, the widths of the source lines and also of the gate lines, which are arranged in a matrix form, should be made narrow. The widths of the source lines and of the gate lines may be determined within such a range that the thin-film transistors employed in the pixel region arranged in a matrix form should be operated. Generally speaking, the widths of the source lines and of the gate lines may be determined within a range where the required display characteristic could be achieved, taking account of the voltage drops occurred in the wiring patterns and also the time constant.

However, in the case that the above-explained anodic oxidation technique is utilized, since the current should be supplied to the gate lines so as to perform the anodic oxidation, the resistance values of these gate electrodes must be considered. That is, the thickness of the oxide layer during the anodic oxidation may be determined based upon the voltage applied to the anode (i.e., gate electrode in this case). When the voltage drops are produced in the gate electrodes, there are differences in the dimensions of the offset gates of the thin-film transistors with respect to each pixel. As a result, there are fluctuations in the characteristics of the thin-film transistors for the respective pixels. Thus, the fluctuations would cause display fluctuations of the display screen and display failures.

As a result of the anodic oxidation, the anodic oxide layer is formed around the gate electrode and the essential portion of the conductor is made narrow, so that sufficient margins should be established.

To solve this problem, both of the width of the gate wiring and also the height thereof should be made sufficiently large, and also the resistance value of this gate wiring must be selected to be such a low level that this resistance value causes no problem during the anodic oxidation. Furthermore, in the active matrix type liquid crystal display device having the large display area, the length of the gate line would be further extended, so that the voltage drop problem would be particularly emphasized. To avoid this voltage drop problem, both of the width of this gate line and the height thereof should be furthermore increased.

However, since widening of the gate line width may cause the numerical aperture to be lowered, the gate line width must be narrowed as much as possible. Moreover, the height of the gate line could not be made unnecessary high in view of the processing method.

As previously described, in the active matrix type liquid crystal display device it is useful for the thin-film transistor arranged in the pixel region to employ such a structure that the anodic oxide layer is fabricated around the gate electrode. However, in order to supply the current required for performing the anodic oxidation to the gate line, the resistance value thereof must be sufficiently reduced. To this end, the required width of the gate line must be sufficiently widened. Nevertheless, when the width of this gate line is made wide, the numerical aperture of the pixel would be lowered. This numerical aperture problem would be emphasized when the large display screen size of the active matrix type liquid crystal display device is manufactured.

SUMMARY OF THE INVENTION

The present invention has been made to solve the above-described problems, and therefore, has an object to provide such a novel technique for fabricating thin-film transistors having uniform characteristics with respect to each of pixels in an active matrix type liquid crystal display device with a large screen size, while assuring the desired numerical aperture of the pixel.

The above-explained voltage drop problem in the gate line as to the technique for forming the anodic oxide around this gate electrode may occur not only in the active matrix type liquid display device, but also in the formation of the integrated circuit with employment of the thin-film transistors, and further in such a case that the anodic oxide layer is formed around the long wiring. In other words, when the uniform anodic oxide is formed on the entire portion of such a long wiring, if the voltage drop problem could be emphasized by the resistance value of this long wiring, then the thickness of the fabricated anodic oxide would be made in accordance with this voltage drop aspect. To solve this problem, the widths of the gate line as well as the wiring would be made wider. However, generally speaking, there is a limitation in these dimensions of these gate line and wiring employed in the integrated circuit.

The present invention has another object to provide another novel technique for fabricating a uniform anodic oxide in the case that the anodic oxidation technique is applied when an integrated circuit having such a long wiring is manufactured.

According to one aspect of the present invention, as disclosed in this specification, a method for manufacturing a semiconductor integrated circuit wherein a large number of insulated gate type field-effect transistors are connected with respect to a single gate line, is comprised of the steps of:

forming a film made of a material capable of performing an anodic oxidation for constructing said single gate line;

forming a plurality of gate lines, a large number of gate electrodes extended from said plural gate lines, and a power supply line connected to said large number of gate electrodes by patterning said film;

forming an anodic oxide layer at least on an exposed surface of said gate electrode by supplying a current to said power supply line in an electrolytic solution; and removing said power supply line.

As the insulated gate type field-effect transistor with the above-described structure, there are conceivable a transistor with employment of a thin-film semiconductor, or a monocrystal silicon substrate.

As the material capable of being anodic-oxidizable in the above-explained structure, there are provided aluminum, tantalum, an alloy made of tantalum and molybdenum, and titanium. Also, an alloy made of these materials, and also a stacked body thereof may be employed. A material containing these materials as a major component may be used. Generally speaking, it is preferable to employ such a material containing either aluminum, or aluminum as a major component. This is because the resistance value of this material is minimum. For instance, the resistivity of tantalum is 180 $\mu\Omega$/cm and the resistivity of chromium is 55 $\mu\Omega$/cm, whereas the resistivity of aluminum is 3 $\mu\Omega$/cm, namely considerably low.

Referring now to FIG. 1, a concrete example of the above-explained structure will be described. FIG. 1 schematically shows a step for manufacturing a structure in which a large number of thin-film transistors (one of them being indicated by reference numeral 301) shown in FIG. 3 are integrated. In the structure indicated in FIG. 3, such a condition is illustrated that two thin-film transistors are connected to a gate line denoted by reference numeral 303.

To manufacture one thin-film transistor (e.g., indicated by reference numeral 301) employed in the structure of FIG. 3, as illustrated in FIG. 1B (B1) and FIG. 1B (B2), a gate line 106, a gate electrode 104, and a power supply line 107 utilized during the anodic oxidation are firstly formed at the same time. This gate line 106 and the gate electrode 104 are produced by patterning a film made of a material containing aluminum as a major component thereof. This aluminum material corresponds to a material capable of being anodic-oxidizable. It should be noted that FIG. 1B (B2) is a sectional view, taken along a line A–A' of FIG. 1B (B1).

Then, the above-described gate line 106, gate electrode 104, and power supply line 107 are used as anodes in an electrolytic solution to perform the anodic oxidation. A current required during the anodic oxidation is supplied from the power supply line 107. In this anodic oxidation step, an anodic oxide layer 105 is fabricated.

After the completion of this anodic oxidation, the power supply line 107 is removed, resulting in such a condition as illustrated in FIG. 1C (C1).

In the structure of FIG. 1, since the power supply line 107 and the gate line 106 are fabricated from the same starting film, both of these lines 106 and 107 own the same film thicknesses. To suppress a voltage drop occurred when the anodic oxidation is carried out, the power supply line 107 has a sufficiently wide width. In other words, the resistance value of the power supply line 107 per unit length thereof is lower than that of the gate line 106 per unit length thereof.

According to another aspect of the present invention, a method for manufacturing a semiconductor integrated circuit having a wiring made of an anodic-oxidizable material, is comprised of the steps of:

forming at least a power supply line connected in parallel to said wiring at the same time when said wiring is patterned;

forming an anodic oxide layer at least on an exposed surface of said wiring by supplying a current to said power supply line in an electrolytic solution; and removing said power supply line.

In accordance with the above-described arrangement, the width of the power supply line is made sufficiently wide, so that the resistance value of the power supply line per unit length thereof can be lowered, as compared with the resistance value of the wiring per unit length thereof. Then, a voltage drop occurred in the power supply line during the anodic oxidation is suppressed, so that even when the length of the gate line is made long, the uniform anodic oxide layer can be manufactured.

In such a structure that the gate electrodes of a large number of thin-film transistors are connected to a single gate line, the power supply line having the sufficiently low resistance value is commonly arranged to all the gate electrodes of the thin-film transistors, independent from the gate line. As a consequence, when the anodic oxide layer is formed around the gate electrode by way of the anodic oxidation, it is possible to solve a voltage drop problem caused by this gate line. Since the width of the gate line may be made narrow at the same time, an integrated circuit may be manufactured in very fine condition.

BRIEF DESCRIPTION OF THE DRAWINGS

For a better understanding of the present invention, reference is made of a detailed description to be read in conjunction with the accompanying drawings, in which:

FIGS. 1A-1-2, 1B-1-2 and 1C-1-2 schematically show a manufacturing step of a thin-film transistor arranged in a pixel portion of an active matrix type liquid crystal display device according to an embodiment of the present invention;

FIGS. 2A-1-2 and 2B-1-2 schematically represent a manufacturing step of another thin-film transistor arranged in the pixel portion of the active matrix type liquid crystal display device according to the embodiment of the present invention;

DETAILED DESCRIPTION OF THE PREFERRED EMBODIMENTS

[EMBODIMENT 1]

Figures 1, 2A:
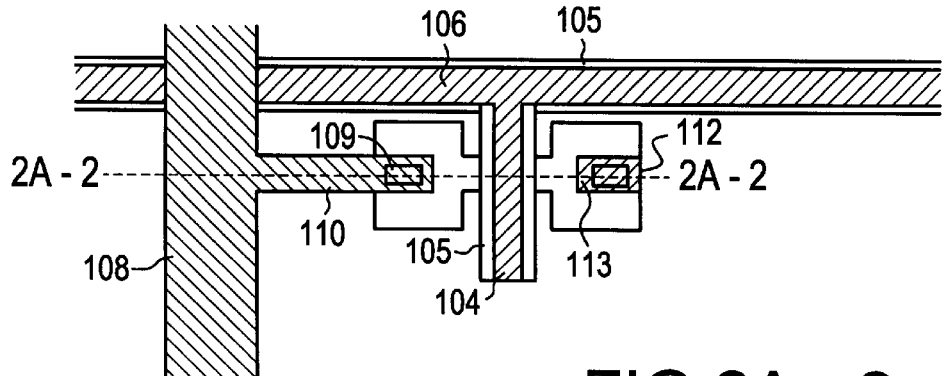

An embodiment 1 of the present invention is accomplished by that in an active matrix type liquid crystal display device, the invention disclosed in this specification has been applied to a thin-film transistor arranged at each of pixels formed in a matrix shape. In FIG. 1, there is shown a structure of a pixel region of the active matrix type liquid crystal display. Although only one pixel is represented in FIG. 1, large quantities (e.g., several hundreds) of pixels are actually arranged in a matrix form.

First, as indicated in FIG. 1A (A2), either an amorphous silicon film, or a crystalline silicon film is formed on a glass substrate 101, and then is patterned, so that an active layer 102 of a thin-film transistor is fabricated. In general, a thickness of an active layer is selected from several hundred Å to several thousands Å.

Generally speaking, it should be noted that although not shown in the drawing, either a silicon oxide film, or a silicon nitride film is fabricated on the glass substrate 101 as an underlayer film. FIG. 1A (A2) is a sectional view, taken along a line A–A' of FIG. 1 A(A1).

Next, as indicated in FIG. 1B(B2), silicon oxide film 103 functioning as a gate insulating film is formed. A thickness of the silicon oxide film 103 is selected to be on the order of 1,000 to 1,500 Å. Furthermore, a film having a thickness of 4,000 Å, which functions as a gate electrode and contains aluminum as a major component, is fabricated and then patterned. As a result, a gate electrode 104 is fabricated. This film containing aluminum as the major component may be formed by employing either the electron beam vapor deposition method, or the sputtering method. 0.1 Wt % of scandium is contained in the film containing aluminum as the major component. This is because containing of scandium can suppress occurrences of "hillock" and "whisker" grown in the subsequent manufacturing steps in connection with the above-explained growth of aluminum. It should be understood that "hillock" implies that as a result of extraordinary growths within aluminum, the grown portions collide with each other, and thus hill shaped portions are produced on the surface of this aluminum. Also, "whisker" implies that extraordinary growths of aluminum are advanced from the surface thereof, and are brought into finely split conditions.

FIG. 1B (B2) is a sectional view, taken along a line B–B' of FIG. 1B (B1). When this gate electrode is fabricated, both of a gate wiring 106 and a power supply line 107 used to the anodic oxidation are formed at the same time. The gate electrode 104, the gate wiring 106, and the power supply line 107 are simultaneously formed, and are connected to each other under this state.

To supply currents required for the anodic oxidation, a width of the power supply line 107 is made sufficiently wide. A height of this power supply line 107 is the same as that of the gate electrode 104, but is not unnecessarily made higher. This is because when the height of the gate electrode 104 is made excessively high, the stepped portion of this higher portion would become unnecessarily high, which could give adverse influences to the formation of the wiring patterns thereon and also the liquid crystal layer (thickness of which being several $\mu$m). In general, the typical height of this gate electrode 104 is limited to be shorter than, or equal to 1 $\mu$m. On the other hand, since the power supply line 107 is removed in the subsequent manufacturing step, the width of this power supply line could be made sufficiently wide irrelevant to the final numeral aperture of the pixel.

A width of the gate wiring 106 may be made narrow, taking account of a width of an anodic oxide layer which will be formed during the subsequent anodic oxidation, and a ranged where this width gives no problem to operations of the thin-film transistor. This may contribute improvements in the numerical aperture.

After the gate electrode 104 has been formed, while this gate electrode 104 is employed as the anode in the electrolytic solution, the anodic oxidation is carried out to thereby form an oxide layer 105. In this embodiment, an ethylene glycol solution whose pH has been controlled by using ammonia is used as the above-described electrolytic solution. Actually, the anodic oxidizing current may flow, and all of the portions dipped in the electrolytic solution may constitute the anode, so that the oxide layer could be fabricated.

In this anodic oxidation stage, the oxide layers 105 are formed on the upper surface and also the side surface, in which the gate line 106, the gate electrode 104, and the power supply line 107 are exposed. The oxide layers contain $Al_2O_3$ as the major component thereof.

By doing so, such a condition as shown in FIG. 1B (B1) and (B2) could be obtained. Next, the power supply line 107 is removed, so that another condition as shown in FIG. 1C (C1) is obtained. The power supply line 107 may be removed in such a manner that a region to be removed is exposed by using a resist mask and then is etched away. As the etching method, either a dry etching with employment of chlorine gas, or a wet etching may be performed. When the wet etching is carried out, a chromic acid mixture is first employed so as to remove the aluminum oxide layer 105 formed on the surface, and furthermore, buffering hydrogen fluoride is employed in order to remove the power supply line 107 containing aluminum as the major component thereof.

FIG. 1C (C2) is a sectional view, taken along a line C–C' of FIG. 1C (C1). Since these sectional views are identical to each other, other than removal of the power supply line 107, FIG. C (C2) is the same as FIG. B(B2).

Thereafter, while using as a mask, both the gate electrode 104 and the oxide layer 105 located around this gate electrode 104, an impurity ion is injected to thereby fabricate a source /drain region. In this case, a phosphorus ion is injected by way of the plasma doping method so as to form an N-channel type thin-film transistor. Moreover, after the impurity ion has been injected, laser light is illuminated, so that the phosphorus (P) ion in the region into which the impurity ion has been injected is activated, and also the damages occurred therein are recovered.

Thus, a source region 10 of the thin-film transistor and a drain region 13 may be formed in the self-alignment manner. Also, a channel forming region 12 and an offset gate region 11 are simultaneously fabricated in the self-alignment manner. The offset gate region 11 is fabricated by that a portion thereof whose thickness is equal to the thickness of the oxide layer 105 functions as a mask during the ion implantation. This oxide layer 105 has been formed around the gate electrode 104 by way of the anodic oxidation.

Next, as represented in FIG. 2A(A1) and FIG. 2A(A2), an interlayer insulating film 111 is formed. The interlayer film 111 is constructed of a silicon oxide film which has been formed by way of the plasma CVD method, while using TEOS gas as a material. A thickness of this interlayer film 111 is selected to be 7,000 Å. It should be noted that FIG. 2A(A2) is a sectional view, taken along a line D–D' of FIG. 2A(A1).

Subsequently, a contact hole 109 is made in the source region 10, and another contact hole 112 is made in the drain region 13. When the contact holes are made, it is preferable to perform the dry etching with employment of chloride gas.

In addition, a three-layer film having such a structure that a film with a thickness of 4,000 Å, containing aluminum as a major component, is sandwiched by a titanium film having a thickness of 1,000 Å is fabricated. In this case, 0.1 Wt % of silicon is contained in the aluminum.

Then, the resultant pixel region is patterned to thereby fabricate a source electrode 110, a source line 108, and furthermore a drain electrode 113 made in contact to the drain region. In this case, the source electrode 110 is extended from the source line 108 and therefore may be formed in an integral form. In this case, the above-described patterning is carried out by using the dry etching.

Figures 2, 2A:
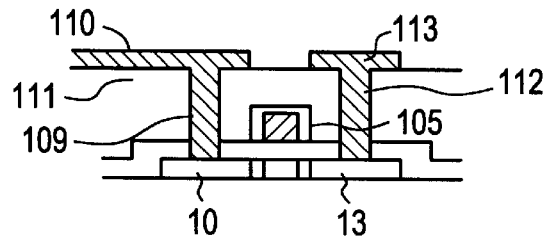

After these conditions shown in FIG. 2 A(A1) and FIG. 2A (A2) have been obtained, a second interlayer insulating film 114 is formed. This second interlayer insulating film 114 is manufactured by way of the plasma CVD method with using the TEOS gas as material, and a thickness of this insulating film 114 is selected to be 4,000 Å.

Figures 1, 2B:
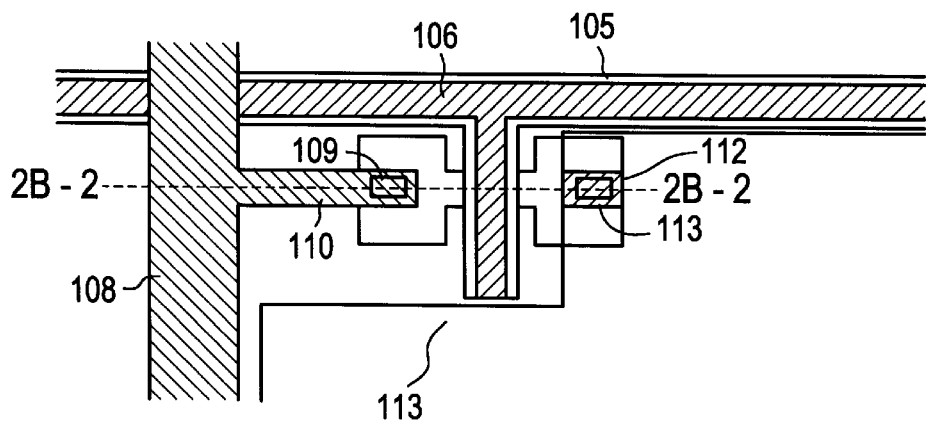
Figures 2, 2B:
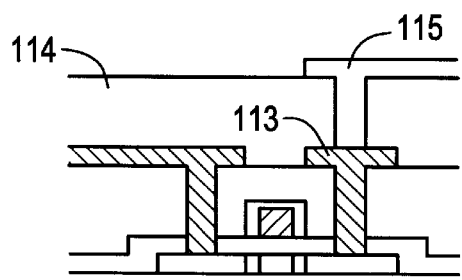

Then, a contact hole is made in the drain electrode 113 to thereby form an pixel electrode 115. The pixel electrode 115 is formed by an ITO. As a result, such conditions as indicated in FIG. 2B(B1) and FIG. 2B(B2) are obtained. Note that FIG. 2B(B2) is a sectional view, taken along a line E–E' of FIG. 2B(B1).

As described above, the formation of the pixel region in the active matrix type liquid crystal display device could be performed. It should be understood that although the step for manufacturing a single pixel has been described in the above explanation, a large number of pixels are simultaneously formed in an actual case by way of similar manufacturing steps. In general, several hundreds of thin-film transistors are connected to the gate line 106.

Figure 3:
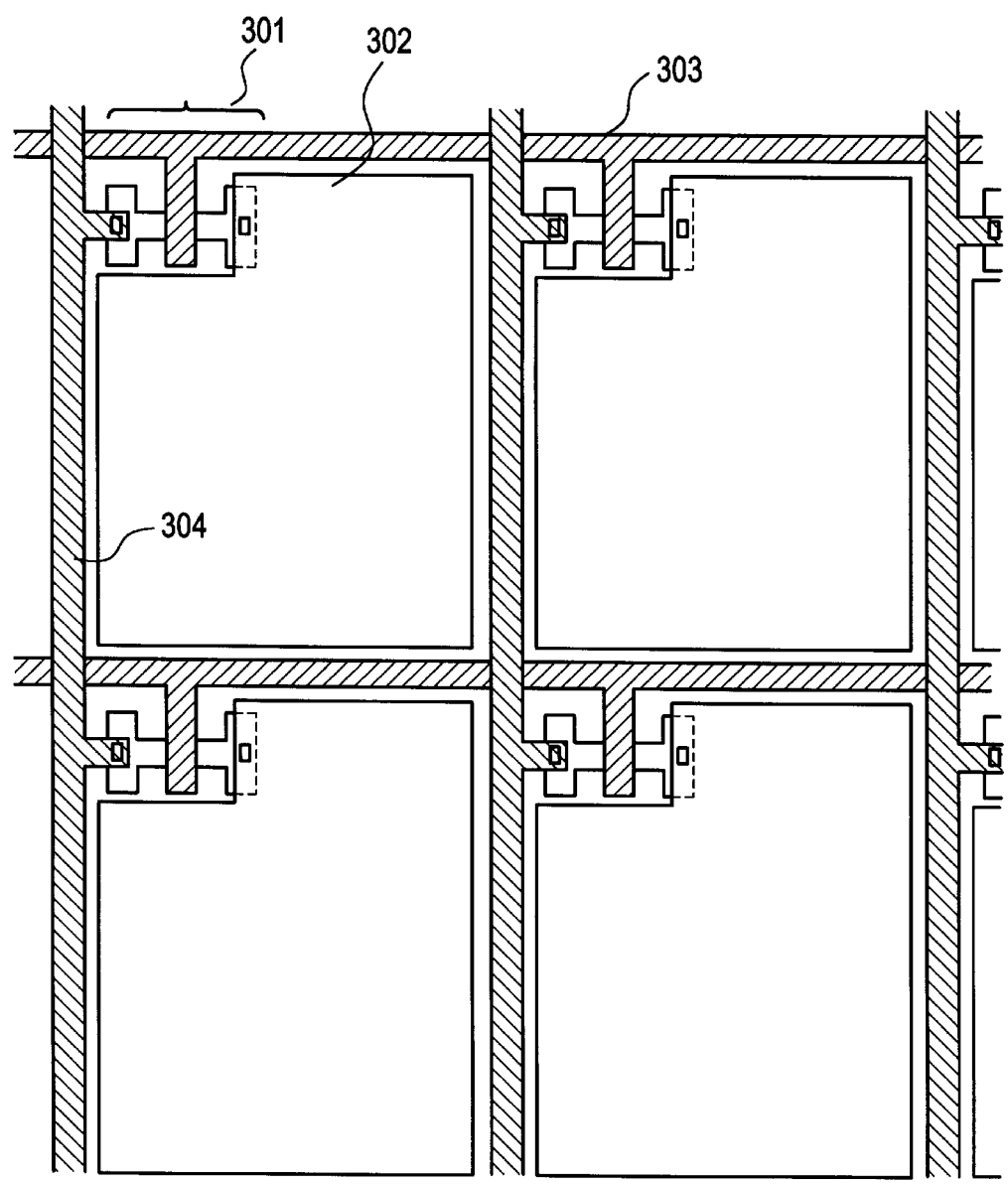
FIG. 3 partially indicates a pixel region of the active matrix type liquid crystal display device constructed of the pixel portion.

In FIG. 3, there is schematically shown a portion of a pixel region of an active matrix type liquid crystal display device which has been formed by employing the manufacturing steps as indicated in this embodiment. Six pixels are represented in the pixel region shown in FIG. 3. In this drawing, reference numeral 301 indicates a thin-film transistor connected to a pixel electrode 302, and reference numeral 303 denotes a gate line connected to the gate electrode of the thin-film transistor 301. It should be noted that a portion of the gate line 303 is extended to thereby the gate electrode. Also, reference numeral 304 shows a source line which is extended to a source electrode connected to the source region of the thin-film transistor 301.

The manufacturing stages as described in this embodiment are very useful when a large quantity (e.g., several hundreds of structures, or more) structures (see FIG. 1 and FIG. 2) are fabricated over a large area. In other words, this manufacturing step may achieve advantages in the case that the length of the gate line 106 becomes very long, and a large number of thin-film transistors having uniform characteristics are fabricated, while assuring the numerical aperture.

The thickness of the anodic oxide layer formed around the gate electrode can be limited within the necessary range at the end portions of the gate line 303 by employing the power supply line 107 (see FIG. 1B(B2)) whose width has been made wide under such a level that the voltage drop does not cause problems. That is, the thickness of the anodic oxide layer can be essentially made equal.

As result of such a fact that the thickness of the anodic oxide layer can be maintained within a constant range, as described above, the dimensional differences in the offset gate region can be maintained within a constant range. Thus, the differences in the characteristics among the thin-film transistors can be improved.

In accordance with this embodiment, the inventive idea disclosed in this specification has been utilized so as to manufacture the pixel region of the active matrix type liquid crystal display device. Alternatively, this inventive idea disclosed in the specification may be employed to fabricate a peripheral drive circuit used to drive the thin-film transistors in the pixel regions.

[EMBODIMENT 2]

An embodiment 2 of the present invention is accomplished by utilizing an inventive idea disclosed in the specification when a large number of thin-film transistors are manufactured at the same time. It should be noted that the embodiment 2 describes such an example where a large quantity of thin-film transistors are, in general, fabricated at the same time, and a specific example realized in accordance with this embodiment 2 corresponds to the above-described embodiment 1. This embodiment 2 may be applied to various sorts of thin-film integrated circuits arranged by thin-film transistors.

Figure 4A:
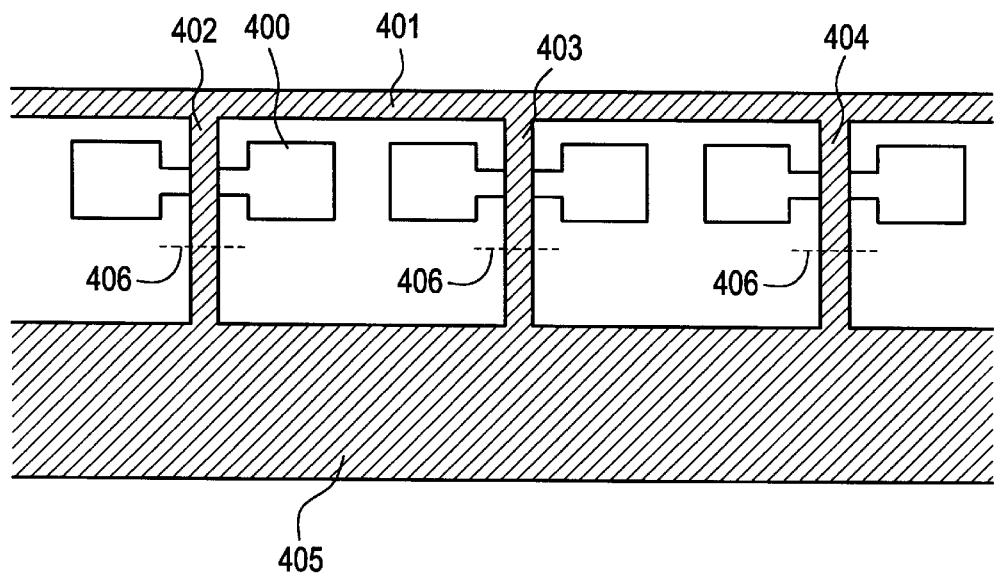
FIGS. 4A and 4B schematically represent a condition where a large number of thin-film transistors are connected with respect to a single gate line.

In FIG. 4, there is represented an example of this embodiment. First, an active layer 400 is fabricated by employing a thin-film semiconductor. As to materials of this active layer 400, either required materials, or useable materials may be employed to constitute this active layer. Then, a gate insulating film (not shown) is formed by a silicon oxide film and the like, and a film having a preselected thickness is formed with an anodic oxidizable material. This anodic oxidizable material is patterned, so that gate electrodes 402 to 404, a gate line 401, and furthermore a current supply line 405 during the anodic oxidation are fabricated. Under this condition, as apparent from the foregoing description, the gate line 401, the gate electrodes 402 to 404, and the current supply line 405 are made in an integral form.

Figure 4B:
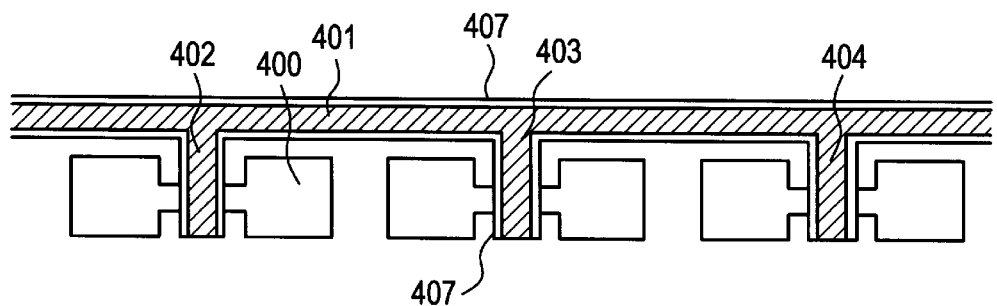

Thereafter, the anodic oxidation is carried out to form an anodic oxide layer around the gate line 401 and the gate electrodes 402 to 404. Subsequently, a portion of the current supply line 405 is removed by setting a portion indicated by a dotted line 406 a boundary, so that such a condition as shown in FIG. 4B is obtained. In the condition indicated in FIG. 4B, a portion noted by reference numeral 407 corresponds to an oxide layer fabricated by way of the anodic oxidation.

In case that the structure as shown in this embodiment 2 is employed, even when the gate line 401 is prolonged, since the current supply line 405 for the anodic oxidation is separately employed whose width can practically neglect the voltage drop occurred during the anodic oxidation, the thicknesses of the anodic oxide layers 407 in the respective thin-film transistors, fabricated by way of the anodic oxidation, can be made uniform.

Figure 5:
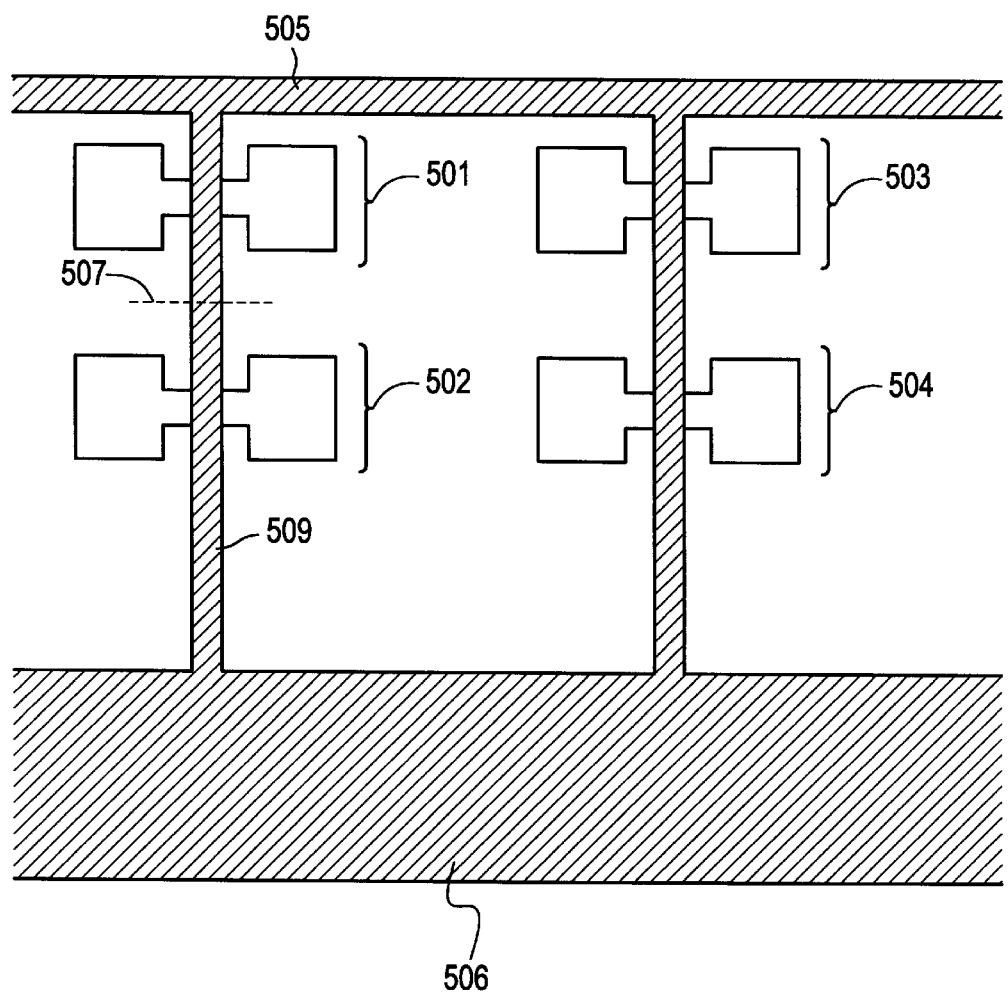
FIG. 5 schematically shows another condition where a large number of thin-film transistors are connected with respect to a single gate line.

As to the structure shown in FIG. 4, the gate electrodes 402 to 404 of all of the thin-film transistors are connected in parallel to the current supply line 405. However, it is possible to connect the gate electrodes 402 to 404 of the thin-film transistors in a series manner within a range where a voltage drop occurred during the anodic oxidation will cause no problem. For instance, as illustrated in FIG. 5, in such a structure that a plurality of thin-film transistors 501 to 504 are connected to a gate line 505, the gate electrodes of two thin-film transistors may be connected in series to each other. This series connection may be achieved within such a range where a voltage drop produced in a gate electrode 509 is negligible. That is to say, since the length of the common gate electrode of the adjoining thin-film transistors becomes short, the voltage drop occurred in this portion during the anodic oxidation is negligible.

In FIG. 5, there is represented such an arrangement that the common gate electrode is provided in the two thin-film transistors. Alternatively, when a power supply line 506 is selectively removed, portions indicated by reference numerals 507 and 508 are removed, so that these thin-film transistors may be formed as independent thin-film transistors.

[EMBODIMENT 3]

An embodiment 3 of the present invention is related to such an arrangement that in the arrangement of the embodiment 1, no anodic oxidation is carried out around the power supply line 107 which will be removed later. Although the power supply line 107 is finally removed, when the wet etching method is utilized, this wet etching method may be readily performed without the anodic oxide.

As a consequence, in accordance with this embodiment 3, since a resist mask is previously formed on a region to be removed after the anodic oxidation has bee performed, no anodic oxidation is carried out in this masked region. Thus, as only the portion containing aluminum as the major component may be etched away in the subsequent etching stage, this etching stage can be easily performed.

While the present invention has been described in detail, since the power supply line used to supply the current for the anodic oxidation is separately provided with the wiring patterns and the electrodes, where the anodic oxidation is performed, the anodic oxidation can be uniformly carried out over the wide area.

For example, in the arrangement that a large number of thin-film transistors are arranged with respect to a single gate line the current supplying power supply lines are connected in parallel to the gate electrodes of the respective thin-film transistors independent from this gate line, and the current is supplied from the power supply lines during the anodic oxidation. As a result, the thicknesses of the anodic oxide layers formed on the gate electrodes for the plenty of thin-film transistors connected to this single power supply line can be substantially made uniform. Then, the resultant characteristics of these thin-film transistors may be made equal.

Also, since the above-described current supplying power supply lines for the anodic oxidation are removed after the anodic oxidation has been performed, the finally formed thin-film integrated circuit may be so arranged as to own the very narrow gate line allowable within a range that this very narrow gate line may sufficiently function as the gate line.

Also, in the active matrix type liquid crystal display device having a large area, even when the gate line is made long, it is possible to suppress the difference in the thickness of the anodic oxide caused by the adverse influence by the voltage drop. Then, the characteristic differences in the thin-film transistors arranged with the respective pixels can be suppressed, so that such a display without fluctuations can be achieved.

What is claimed is:

1. A method for manufacturing an active matrix liquid crystal display including at least one thin-film transistor comprising the steps of:

forming a gate line extended in a substantially horizontal direction, a gate electrode of said transistor being extended in a substantially vertical direction from said gate line;

forming at least a power supply line located in parallel to said gate line, said power supply line being directly connected to said gate electrode which is connected to said gate line;

simultaneously forming an anodic oxide layer on at least said gate electrode and said gate line by supplying a current into at least said gate electrode and said gate line through said power supply line in an electrolytic solution; and removing said power supply line after formation of said anodic oxide layer.

2. A method according to claim 1 further comprising the step of removing an anodic oxide layer formed around said power supply line.

3. A method according to claim 1 wherein said transistor is connected to each of pixel electrodes arranged in a matrix form.

4. A method according to claim 1 wherein said gate line, gate electrode and power supply line are simultaneously formed by patterning an anodic oxidizable material.

5. A method according to claim 4 wherein said anodic oxidizable material is formed over an insulating substrate after forming an active layer and a gate insulating film on said substrate.

6. A method according to claim 4 wherein said anodic oxidizable material contains aluminum.

7. A method according to claim 1 wherein said anodic oxide layer is formed in said electrolytic solution by employing at least said gate electrode as an anode.

8. A method according to claim 1 wherein said anodic oxide layer is formed around said gate electrode in order to form an offset gate structure that said gate electrode is apart from source and drain regions of said transistor.

9. A method according to claim 8 wherein said source and drain regions are formed in a self-alignment manner by using said gate electrode and anodic oxide layer as a mask.

10. A method according to claim 1 wherein a resistance value of said power supply line per unit length is lower than that of said gate line per unit length.

11. A method according to claim 10 wherein a width of said power supply line is larger than that of said gate line.

12. A method according to claim 1 wherein said anodic oxidation is performed in condition that said power supply line is covered with a mask in order to prevent said anodic oxide layer from being formed around said power supply line.

13. A method according to claim 1 wherein a plurality of said gate electrodes are extended in parallel from said gate line; and a plurality of transistors are connected to each of said gate electrodes in series.

14. A method according to claim 13 wherein said anodic oxidation is performed such that thicknesses of said anodic oxide layers become substantially uniform each other.

15. A method for manufacturing a semiconductor integrated circuit having, over a substrate, a plurality of gate lines extending in parallel, a plurality of signal lines extending orthogonally with respect to said gate lines, a plurality of thin film transistors provided at intersections between said plurality of gate lines and said plurality of signal lines wherein each of gate electrodes of said thin film transistors is electrically connected to the corresponding one of the gate lines, said method comprising the steps of:

forming at least one power supply line over the substrate in parallel with said gate lines, said power supply line directly connected to the gate electrodes which are connected to at least one of said gate lines;

simultaneously anodically oxidizing the gate electrodes and said at least one of the gate lines by applying a voltage to said power supply line; and then removing said power supply line.

16. A method for manufacturing a semiconductor integrated circuit having, over a substrate, a plurality of gate lines extending in parallel, a plurality of signal lines extending orthogonally with respect to said gate lines, a plurality of thin film transistors provided at intersections between said plurality of gate lines and said plurality of signal lines wherein each of gate electrodes of said thin film transistors is electrically connected to the corresponding one of the gate lines, said method comprising the steps of:

forming a plurality of power supply lines over said substrate, wherein said power supply lines are arranged in parallel with said gate lines and each one of the power supply lines is directly connected to said gate electrodes which are connected to corresponding one of the gate lines;

simultaneously anodically oxidizing the gate electrodes and the gate lines by applying a voltage to said power supply lines; and then removing said power supply lines.

* * * * *